United States Patent
Liu et al.

(10) Patent No.: US 8,661,395 B2
(45) Date of Patent: Feb. 25, 2014

(54) METHOD FOR DUMMY METAL AND DUMMY VIA INSERTION

(71) Applicant: Taiwan Semiconductor Manufacturing Company, Ltd., Hsinchu (TW)

(72) Inventors: Hung-Yi Liu, Pingjhen (TW); Chung-Hsing Wang, Baoshan Township (TW); Chih-Chieh Chen, Jia-an Village (TW); Jian-Yi Li, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/646,065

(22) Filed: Oct. 5, 2012

(65) Prior Publication Data
US 2013/0097571 A1 Apr. 18, 2013

Related U.S. Application Data

(63) Continuation of application No. 12/728,728, filed on Mar. 22, 2010, now Pat. No. 8,307,321.

(60) Provisional application No. 61/162,011, filed on Mar. 20, 2009.

(51) Int. Cl.
*G06F 17/50* (2006.01)

(52) U.S. Cl.
USPC ............ 716/126; 716/110; 716/111; 716/130

(58) Field of Classification Search
USPC ................. 716/110–113, 118–119, 122, 126, 716/129–130, 132, 134–135
See application file for complete search history.

(56) References Cited

U.S. PATENT DOCUMENTS

| | | | |
|---|---|---|---|
| 6,748,579 B2 | 6/2004 | Dillon et al. | |
| 7,007,258 B2 | 2/2006 | Li | |
| 7,234,125 B1* | 6/2007 | Scott et al. | 716/102 |
| 7,565,638 B2 | 7/2009 | Hoerold | |
| 7,574,685 B1 | 8/2009 | Dong et al. | |
| 7,661,078 B1 | 2/2010 | Noice et al. | |
| 7,673,268 B2 | 3/2010 | Kashyap et al. | |
| 7,725,850 B2 | 5/2010 | Darden et al. | |
| 7,890,914 B2 | 2/2011 | Jensen | |
| 7,949,981 B2 | 5/2011 | Greco | |
| 8,161,425 B1* | 4/2012 | Noice et al. | 716/55 |
| 2002/0056070 A1 | 5/2002 | Tanaka | |
| 2004/0015796 A1* | 1/2004 | Frank et al. | 716/5 |
| 2006/0195809 A1* | 8/2006 | Cohn et al. | 716/10 |
| 2007/0148794 A1 | 6/2007 | Cha et al. | |
| 2007/0256042 A1 | 11/2007 | Kashyap et al. | |
| 2007/0266356 A1 | 11/2007 | Chang et al. | |
| 2008/0005704 A1 | 1/2008 | Miloslavsky et al. | |
| 2009/0031261 A1 | 1/2009 | Smith et al. | |

(Continued)

*Primary Examiner* — Stacy Whitmore (74) *Attorney, Agent, or Firm* — Lowe Hauptman & Ham, LLP (57) ABSTRACT

A method of inserting dummy metal and dummy via in an integrated circuit design. The method includes inserting, by a computer, dummy metals using a place and route tool, wherein the place and route tool has timing-awareness to improve a timing performance of the integrated circuit design. The method further includes inserting, by the computer, dummy vias using a design-rule-checking utility separately from the inserting of the dummy metals, wherein at least one of the dummy vias has a different size than at least another of the dummy vias.

20 Claims, 7 Drawing Sheets

(56) References Cited

U.S. PATENT DOCUMENTS

| | | |
|---|---|---|
| 2009/0089732 A1 | 4/2009 | van Adrichem et al. |
| 2009/0132985 A1 | 5/2009 | Hsu et al. |
| 2009/0199147 A1 | 8/2009 | Jensen |
| 2009/0254874 A1* | 10/2009 | Bose ............................... 716/6 |
| 2009/0300561 A1 | 12/2009 | Tong et al. |
| 2009/0319968 A1 | 12/2009 | Wang et al. |
| 2010/0218151 A1* | 8/2010 | Nakano ............................. 716/5 |
| 2010/0257502 A1* | 10/2010 | Matsuoka ....................... 716/11 |
| 2011/0289471 A1 | 11/2011 | Anikin et al. |
| 2012/0131534 A1* | 5/2012 | Pekarek ........................ 716/122 |

* cited by examiner

METHOD FOR DUMMY METAL AND DUMMY VIA INSERTION

CROSS-REFERENCE TO RELATED APPLICATIONS

The present application is a continuation of U.S. application Ser. No. 12/728,728 filed Mar. 22, 2010, which claims priority of U.S. Provisional Patent Application Ser. No. 61/162,011, filed on Mar. 20, 2009, both of which are incorporated herein by reference in their entirety.

TECHNICAL FIELD

The present disclosure relates generally to dummy metal and dummy via insertion in integrated circuit design.

BACKGROUND

In integrated circuit design, the via density requirement become imperative due to yield and reliability concerns. If either the metal or via density is not sufficient, the low-k material popularly used in advanced integrated circuits is not robust to Chemical-Mechanical Polishing (CMP) process or LD-free bumping process during manufacturing.

For a given integrated circuit design, usually placement and routing are performed by Place and Route (P&R) tools. By P&R, a layout of a larger block of the circuit or the whole circuit is created from layouts of smaller sub-blocks. The first step, placement, involves deciding where to place all electronic components, circuitry, and logic elements in a generally limited amount of space. This is followed by routing, which decides the exact design of all the wires needed to connect the placed components. This step must implement all the desired connections while following the rules and limitations of the manufacturing process.

Afterwards, dummy metal and dummy via insertion on the placed and routed design is performed by either a P&R tool or a design-rule-checking (DRC) utility. However, both methods have problems. If the P&R tool is used for dummy metal/via insertion, it requires long runtime, generates very big sized graphic data system (GDS) files, and could produce undesirable results due to algorithmic flaws of the conventional P&R tools. For example, a P&R tool treats every dummy via as a single instance in the GDS file, which contributes to the huge size of the GDS file. And no dummy via drops are allowed below or upon non-default-width dummy metal. Also, only a few via array structures are allowed because of execution time and database size necessary for the P&R tools to recognize and examine the design. Further, the insert-via-first method in P&R tools hinders potential dummy metal/via insertion later on, because of spacing and other rules.

On the other hand, if the DRC tool is used for dummy metal/via insertion, it requires large timing-checking loops for the design closure due to the timing-unawareness of DRC utility. The timing is the speed performance of the chip or integrated circuit design. The method that requires large timing-checking loops by using a DRC utility takes more time to finish the design.

Accordingly, new methods for dummy metal and dummy via insertion are desired that are faster and more flexible, provide sufficient via density, and reduce the GDS file size.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments disclosed, and do not limit the scope of the invention.

A method for dummy metal and dummy via insertion for an integrated circuit design is provided. Throughout the various views and illustrative embodiments of the present disclosure, like reference numbers are used to designate like elements.

Figure 1A:
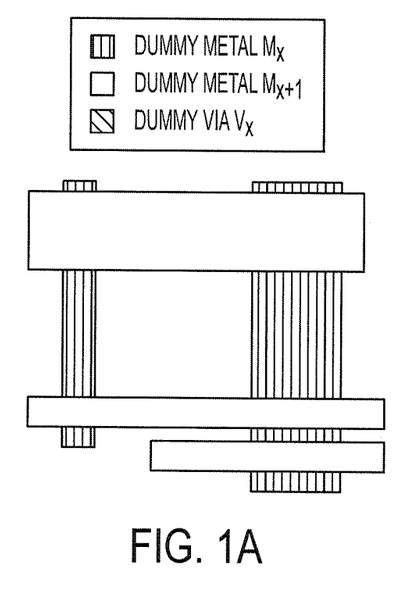
FIGS. 1A-1D illustrate an example process according to one embodiment.

FIGS. 1A-1D illustrate an example process according to one embodiment. FIG. 1A illustrates the step of dummy metal insertion is shown using variable rectangles by a P&R tool that is timing-aware. The timing awareness of P&R tool helps the timing check of the layout later on.

Figure 1B:
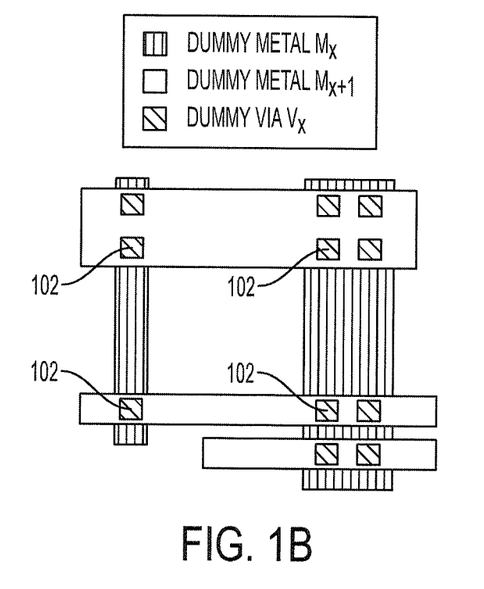

FIG. 1B illustrates the step of dummy via insertion using via arrays inside dummy-metal overlaps by DRC utilities. In some embodiments, the insertion of the dummy via 102 can be performed after the step of dummy metal insertion by P&R as shown in FIG. 1A.

Figure 1C:
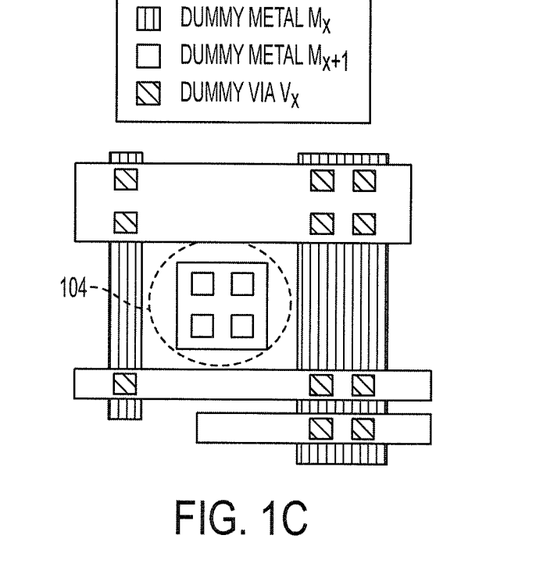

FIG. 1C illustrates the step of fine-grained N×M via-array insertion inside white (available) space at a location far away (e.g. not adjacent) from main pattern by DRC utilities. In some embodiments, this step can be performed after the step shown in FIG. 1B.

Figure 1D:
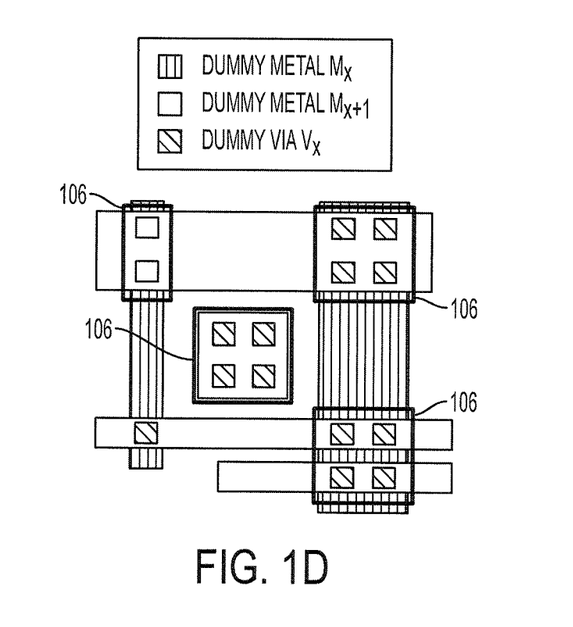

FIG. 1D illustrates the step of automatic dummy-pattern compression using DRC utilities for GDS file-size reduction. In some embodiments, this step can be performed after the step shown in FIG. 1C.

In one embodiment that followed the steps illustrated in FIG. 1A-1D, the via density increased about 20%, the run time to complete the dummy metal/via insertion was 5.6 times faster, and the GDS file size was reduced by 3.2 times compared to a conventional method using P&R tools.

Regarding FIGS. 1A-1D, there still could be some improvements in via density. The shape and spacing of dummy-metal shown in FIG. 1A is similar to the shape and spacing of main-pattern-metal. If the shape or spacing rules of dummy via are looser than main pattern's rules, then higher via density could be achieved in FIG. 1B.

Figure 2A:
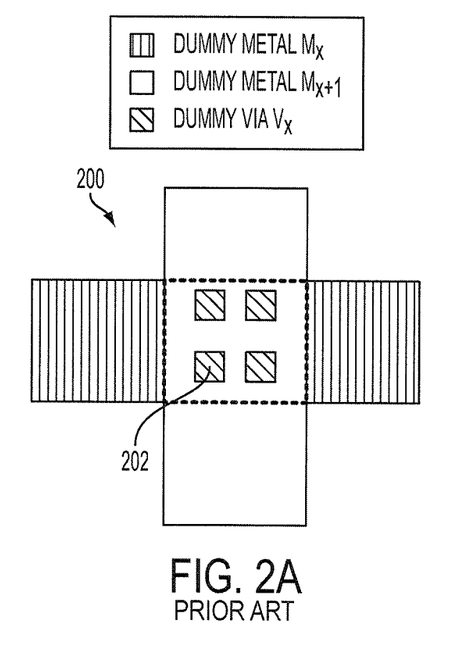
FIG. 2A illustrates an example of square dummy via insertion according to a conventional design method.
Figure 2B:
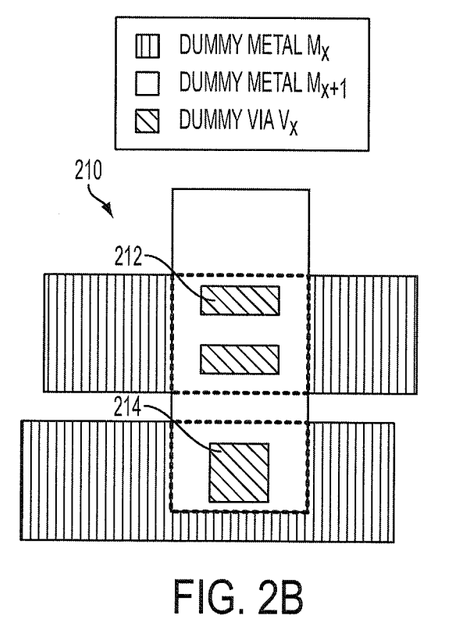
FIG. 2B illustrates an example of rectangular dummy via insertion according to one embodiment.

For example, in some embodiments, the dummy via shape can be either square or rectangle, and can have different sizes. Rectangular via, also known as slot via, can be used to increase the via density (since inter-via spacing is avoided). FIG. 2A illustrates an example of square dummy via 202 insertions in the layout 200 according to a conventional design method. In comparison, FIG. 2B illustrates an example of rectangular dummy via 212 insertion in the layout 210 according to one embodiment. Using rectangular via can increase the via density by 1.3-1.5 times compared to square-only via scheme. Also, if main-pattern via array spacing rule is 0.09 um and the dummy via array spacing rule is relaxed to 0.07 um, higher via density can be achieved. Likewise, square via with multiple sizes is also better than square via with single size, in terms of via density. The square via 214 in FIG. 2B has a different size compared to the square via 202 in FIG. 2A.

Figure 2C:
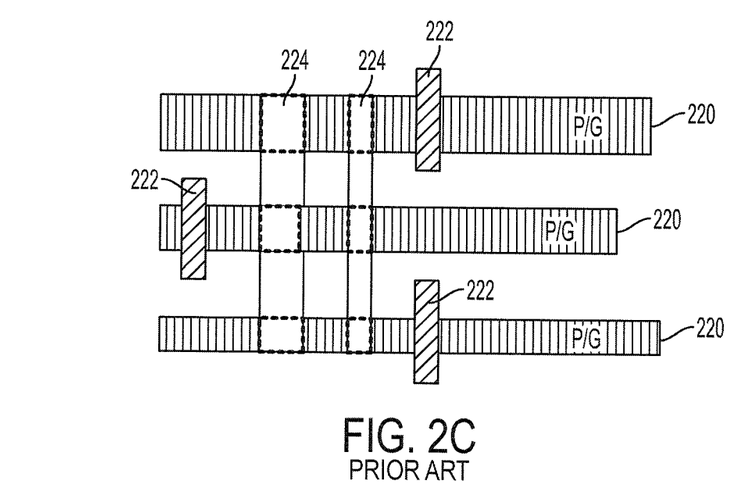
FIG. 2C illustrates an example of inserting dummy metal/via on power/ground wire according to a conventional design.
Figure 2D:
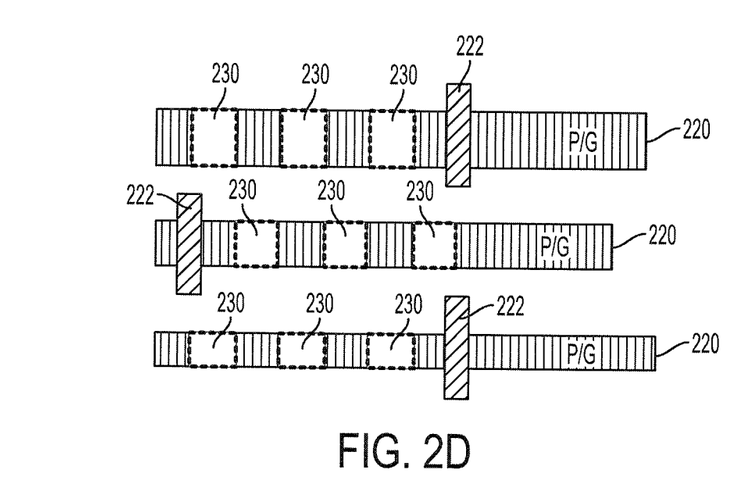
FIG. 2D illustrates an example of inserting dummy metal/via on power/ground wire without alignment constraint.

Another way to improve the via density is to insert dummy via on active Power/Ground (P/G) wires without alignment constraint in P/G-wire-congested region, where normal dummy insertion is not easy. In P/G-wire-congested area, dummy via could be inserted on active P/G wires if this does not short P/G wires. FIG. 2C illustrates an example of inserting dummy metal/via on power/ground wire according to a conventional design. The signal wires 222 are placed on top of the P/G wire 220, and the dummy metal/via 224 are placed so that the dummy vias are aligned with each other over multiple P/G wires 220. However, without the alignment constraint, more dummy vias could be placed as shown in FIG. 2D. FIG. 2D illustrates an example of inserting dummy metal/via on power/ground wire without alignment constraint. The dummy metal/vias 230 are placed on the P/G wires 220 without alignment constraint, and more vias were placed as a result.

Figure 2E:
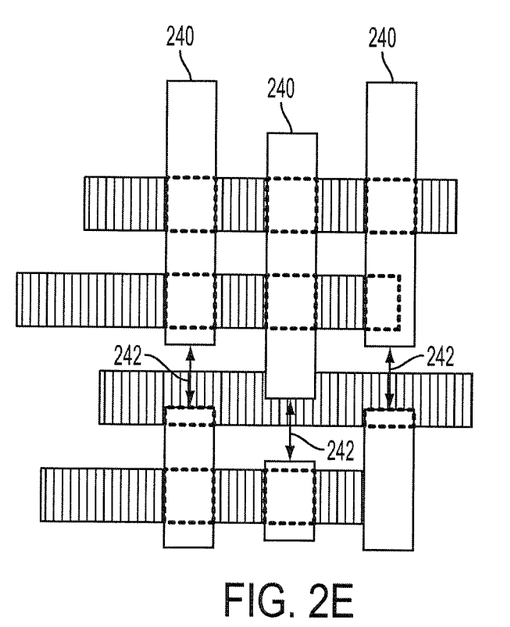
FIG. 2E illustrates dummy metals with constant line-end spacings therebetween.

Further, in some embodiments, the line-end spacing between dummy metals can be constant for better process control, and the maximum length of dummy metal can be limited to reduce coupling effects. FIG. 2E illustrates the dummy metals 240 with constant line-end spacing 242 between them.

Figure 3:
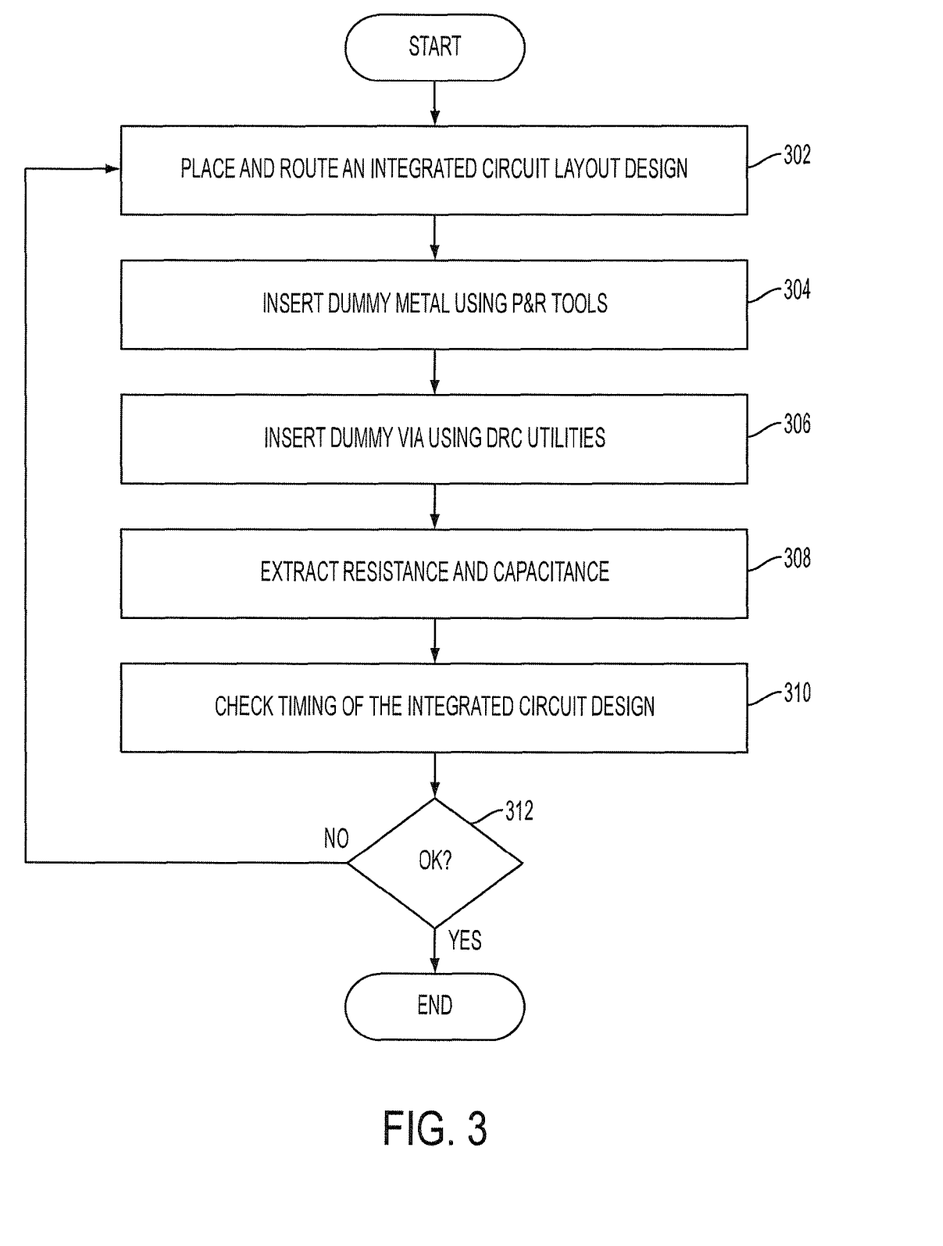
FIG. 3 is a flow chart of a dummy metal and dummy via insertion method according to one embodiment.

FIG. 3 is a flow chart of a dummy metal and dummy via insertion method according to one embodiment of this disclosure. At step 302, an integrated circuit layout design is placed and routed. At step 304, dummy metal is inserted using P&R tools. Because the P&R tool has timing-awareness, the placement of the dummy metal is done with timing considerations. At step 306, dummy vias are inserted using DRC utilities. As shown in FIG. 1B, in some embodiments, the dummy vias are inserted using via arrays inside dummy-metal overlaps by DRC utilities. Also, in some embodiments, a fine-grained N×M dummy via-array 104 is inserted inside a white (available) space at a location far away from main pattern by DRC utilities as shown in FIG. 1C. Further, in other embodiments, automatic dummy-pattern compression of a dummy pattern 106 of the inserted dummy vias can be performed using DRC utilities for GDS file-size reduction, as shown in FIG. 1D. At step 308, resistance and capacitance is extracted from the layout to be used in the timing analysis. At step 310, timing of the integrated circuit design is checked. At step 312, if the timing check result is OK, then the design is finished. If not, the design should go back to the step 302 of place and route.

Figure 4:
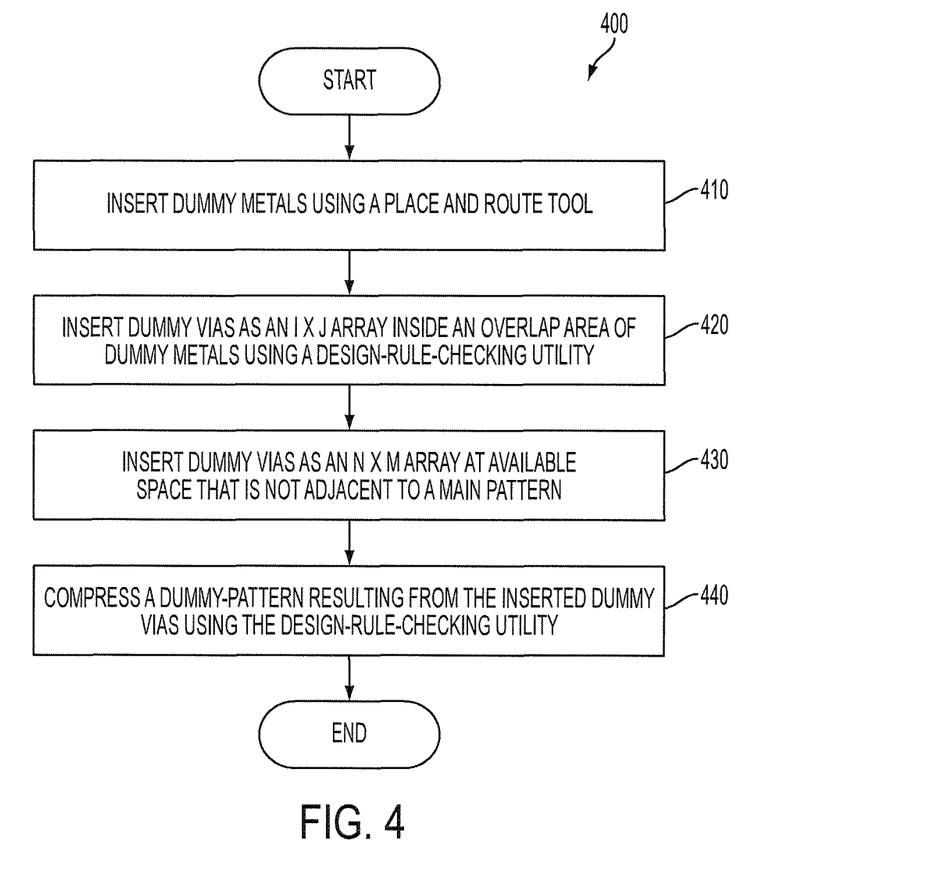
FIG. 4 is a flow chart of a dummy metal and dummy via insertion method according to one embodiment.

FIG. 4 is a flow chart of a dummy metal and dummy via insertion method according to one embodiment of this disclosure. At step 410 and using a P&R tool, dummy metals are inserted. Because the P&R tool has timing-awareness, the placement of the dummy metal is done with timing considerations. At step 420 and using DRC utilities, dummy vias are inserted as an I×J array (I and J are positive integers) inside an overlap area of dummy metals, as described with respect to FIG. 1B. At step 430, dummy vias are inserted as an N×M array (N and M are positive integers) at an available space that is not adjacent to a main pattern, as described with respect to FIG. 1C. At step 440 and using the DRC utilities, a dummy-pattern resulting from the inserted dummy vias is compressed to reduce a size of a GDS file generated from the integrated circuit design, as described with respect to FIG. 1D.

However, there could be variations on the method based on applications. For customized design (no automatic place-and-route involved) to use the various dummy pattern (e.g. rectangular via, multiple-size square via, relaxed spacing rules, etc.), DRC utilities can be used for inserting dummy metals, since timing analysis for customized design is based on GDS database only. In one example for the relaxed spacing rules, a dummy via spacing rule can be relaxed compared to a main pattern via array spacing rule. For example, if main-pattern via array spacing rule is 0.09 um and the dummy via array spacing rule is relaxed to 0.07 um, higher via density can be achieved. Thus there is no impact on timing analysis in the customized design flow in this case.

Figure 5:
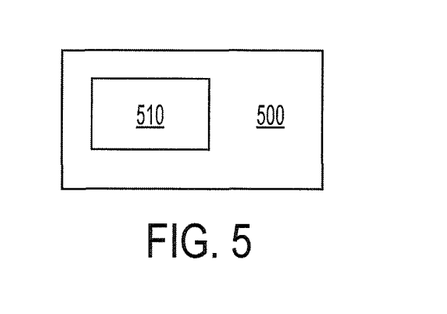
FIG. 5 is a block diagram of a computer according to one embodiment.

FIG. 5 is a block diagram of a computer 500 according to one embodiment. The computer 500 comprises a processor 510 configured to implement a dummy metal and dummy via insertion method according to one or more embodiments disclosed herein.

One aspect of this description relates to a method of inserting dummy metal and dummy via in an integrated circuit design. The method includes inserting, by a computer, dummy metals using a place and route tool, wherein the place and route tool has timing-awareness to improve a timing performance of the integrated circuit design. The method further includes inserting, by the computer, dummy vias using a design-rule-checking utility separately from the inserting of the dummy metals, wherein at least one of the dummy vias has a different size than at least another of the dummy vias.

Another aspect of this description relates to a method of inserting dummy metal and dummy via in an integrated circuit design. The method includes inserting, by a computer, dummy metals using a place and route tool, wherein the place and route tool has timing-awareness to improve a timing performance of the integrated circuit design, and the dummy metals have a length less than or equal to a predetermined maximum length. The method further includes inserting, by the computer, dummy vias using a design-rule-checking utility separately from the inserting of the dummy metals.

Still another aspect of this description relates to a method of inserting dummy metal and dummy via in an integrated circuit design. The method includes inserting, by a computer, dummy metals using a place and route tool, wherein the place and route tool has timing-awareness to improve a timing performance of the integrated circuit design. The method further includes inserting, by the computer, dummy vias using a design-rule-checking utility separately from the inserting of the dummy metals, wherein a space between adjacent dummy vias is from 0.07 microns (μm) and 0.09 μm.

Although the present disclosure and its advantages have been described in detail, it should be understood that various changes, substitutions and alterations can be made herein without departing from the spirit and scope of the invention. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of inserting dummy metal and dummy via in an integrated circuit design, comprising:
    inserting, by a computer, dummy metals using a place and route tool, wherein the place and route tool has timing-awareness to improve a timing performance of the integrated circuit design; and
    inserting, by the computer, dummy vias using a design-rule-checking utility separately from the inserting of the dummy metals, wherein at least one of the dummy vias has a different size than at least another of the dummy vias,
    wherein inserting dummy vias comprises inserting vias onto adjacent power and ground wires, and inserting vias onto adjacent power and ground wires comprises inserting vias on one of the adjacent power and ground wires which is not aligned with vias on another of the adjacent power and ground wires.

2. The method of claim 1, wherein inserting dummy vias further comprises inserting a first via having a first shape and a second via having a second shape different than the first shape.

3. The method of claim 1, wherein inserting dummy vias further comprises inserting a first via having a first size and a second via having a second size different than the first size.

4. The method of claim 1, wherein inserting dummy metals comprises inserting dummy metals using a first spacing rule, and inserting dummy vias comprises inserting dummy vias using a second spacing rule different than the first spacing rule.

5. The method of claim 1, further comprising reducing a size of a graphic data system file for the integrated circuit design, using the computer, by compressing a pattern of the inserted dummy vias.

6. The method of claim 1, wherein inserting the dummy metals comprises inserting the dummy metals having a length less than or equal to a predetermined maximum length.

7. The method of claim 1, further comprising extracting, by the computer, resistance and capacitance from the integrated circuit design.

8. The method of claim 1, wherein inserting the dummy vias further comprises inserting a space between adjacent dummy vias, the space being from 0.07 microns (μm) and 0.09 μm.

9. The method of claim 8, wherein inserting dummy metals comprises spacing the dummy metals to have a space of at least 0.09 microns (μm) between adjacent dummy metals.

10. The method of claim 1, wherein inserting the dummy vias further comprises inserting at least one dummy via at a location away from the power and ground wires.

11. A method of inserting dummy metal and dummy via in an integrated circuit design, comprising:
    inserting, by a computer, dummy metals using a place and route tool, wherein the place and route tool has timing-awareness to improve a timing performance of the integrated circuit design;
    inserting, by the computer, dummy vias using a design-rule-checking utility separately from the inserting of the dummy metals, wherein at least one of the dummy vias has a different size than at least another of the dummy vias, and inserting vias onto adjacent power and ground wires, and inserting vias on one of the adjacent power and ground wires which is not aligned with vias on another of the adjacent power and ground wires; and
    extracting, by the computer, resistance and capacitance from the integrated circuit design.

12. The method of claim 11, wherein inserting the dummy vias comprises inserting a space between adjacent dummy vias, the space being from 0.07 microns (μm) and 0.09 μm.

13. The method of claim 11, wherein inserting the dummy metals comprises inserting the dummy metals having a length less than or equal to a predetermined maximum length.

14. The method of claim 11, wherein inserting dummy metals comprises inserting dummy metals using a first spacing rule, and inserting dummy vias comprises inserting dummy vias using a second spacing rule different than the first spacing rule.

15. The method of claim 11, wherein inserting the dummy vias comprises inserting a space between adjacent dummy vias, the space being from 0.07 microns (μm) and 0.09 μm.

16. The method of claim 15, wherein inserting the dummy vias further comprises inserting a space between adjacent dummy vias, the space being from 0.07 microns (μm) and 0.09 μm.

17. The method of claim 15, wherein inserting the dummy metals comprises inserting the dummy metals have a length less than or equal to a predetermined maximum length.

18. The method of claim 11, wherein inserting the dummy vias further comprises inserting at least one dummy via at a location away from the power and ground wires.

19. A method of inserting dummy metal and dummy via in an integrated circuit design, comprising:
    inserting, by a computer, dummy metals using a place and route tool, wherein the place and route tool has timing-awareness to improve a timing performance of the integrated circuit design, and the dummy metals are inserted using a first spacing rule; and
    inserting, by the computer, dummy vias using a design-rule-checking utility separately from the inserting of the dummy metals, wherein at least one of the dummy vias has a different size than at least another of the dummy vias, inserting vias onto adjacent power and ground wires, and inserting vias on one of the adjacent power and ground wires which is not aligned with vias on another of the adjacent power and ground wires, and the dummy vias are inserted using a second spacing rule different than the first spacing rule.

20. The method of claim 19, wherein inserting the dummy vias further comprises inserting at least one dummy via at a location away from the power and ground wires.

* * * * *